United States Patent

Breitwisch et al.

(10) Patent No.: US 7,378,710 B2
(45) Date of Patent: May 27, 2008

(54) FINFET SRAM CELL USING INVERTED FINFET THIN FILM TRANSISTORS

(75) Inventors: Matthew Breitwisch, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 10/539,335

(22) PCT Filed: Dec. 19, 2002

(86) PCT No.: PCT/US02/40868

§ 371 (c)(1), (2), (4) Date: Jun. 15, 2005

(87) PCT Pub. No.: WO2004/059703

PCT Pub. Date: Jul. 15, 2004

(65) Prior Publication Data

US 2006/0068531 A1 Mar. 30, 2006

(51) Int. Cl.
H01L 21/00 (2006.01)

(52) U.S. Cl. ........................ 257/347; 257/348
(58) Field of Classification Search ......... 257/347–348
See application file for complete search history.

(56) References Cited

U.S. PATENT DOCUMENTS

| 6,300,182 | B1 * | 10/2001 | Yu ........................ 438/217 |
|---|---|---|---|
| 6,413,802 | B1 * | 7/2002 | Hu et al. ................ 438/151 |
| 6,475,890 | B1 * | 11/2002 | Yu ........................ 438/574 |
| 6,525,403 | B2 * | 2/2003 | Inaba et al. ............. 257/618 |
| 7,221,032 | B2 * | 5/2007 | Kondo .................... 257/401 |
| 2005/0156202 | A1 * | 7/2005 | Rhee et al. ............. 257/213 |
| 2006/0011977 | A1 * | 1/2006 | Kondo .................... 257/347 |
| 2006/0068531 | A1 * | 3/2006 | Breitwisch et al. ...... 438/149 |
| 2007/0047357 | A1 * | 3/2007 | Choi et al. .............. 365/207 |

* cited by examiner

Primary Examiner—Laura M Schillinger
(74) Attorney, Agent, or Firm—Jay H. Anderson

(57) ABSTRACT

An integrated circuit, such as a SRAM cell (130), including an inverted FinFET transistor (P2) and a FinFET transistor (N3). The inverted FinFET transistor includes a first gate region (108) formed by semiconductor structure (100) on a substrate, a first body region comprised of a semiconductor layer (104), having a first channel region (112) disposed on the first gate region and a source (110) and drain (114) formed on either side of the first channel region. The FinFET transistor (N3) is coupled to the inverted FinFET transistor, and includes a second body region formed by the semiconductor structure (102), having a second channel region (118), and a source (116) and drain (120) formed on either side of the second channel region, and a second gate region (122) comprised of the semiconductor layer, disposed on the second channel region.

8 Claims, 12 Drawing Sheets

US 7,378,710 B2

FINFET SRAM CELL USING INVERTED FINFET THIN FILM TRANSISTORS

TECHNICAL FIELD

The present invention relates in general to integrated circuits. More particularly, the present invention is directed to an inverted FinFET thin film transistor, and a static random access memory (SRAM) cell that is formed using inverted FinFET thin film transistors.

BACKGROUND ART

One important characteristic of a SRAM cell is the surface area required to form the cell on an integrated circuit chip. By reducing the size of the SRAM cell, a higher density SRAM can be fabricated. Although many techniques have been successfully employed to provide higher density SRAMs, the demand for higher and higher density SRAMs continues unabated. Accordingly, there is a continuous need to produce ever smaller SRAM cells.

DISCLOSURE OF THE INVENTION

The present invention provides an inverted FinFET thin film transistor, and a static random access memory (SRAM) cell that is formed using inverted FinFET thin film transistors. The SRAM cell has a simplified layout and a substantially reduced surface area, thereby allowing a higher density SRAM to be produced.

A first aspect of the invention provides an integrated circuit including a first transistor, comprising: a first gate region comprised of a semiconductor structure on a substrate; a first body region comprised of a semiconductor layer, having a first channel region disposed on the first gate region and a source and drain formed on either side of the first channel region; and a second transistor coupled to the first transistor, comprising: a second body region comprised of the semiconductor structure, having a second channel region and a source and drain formed on either side of the second channel region; and a second gate region comprised of the semiconductor layer, disposed on the second channel region.

A second aspect of the invention provides an integrated circuit, comprising: first and second transistors; and a single semiconductor layer that forms a source, drain, and channel of the first transistor and a gate of the second transistor.

A third aspect of the invention provides an integrated circuit, comprising: a semiconductor fin; an inverted FinFET transistor, wherein the fin forms a gate of the inverted FinFET transistor; and a first FinFET transistor, wherein the fin forms a source, drain, and channel of the first FinFET transistor and wherein the gate of the inverted FinFET transistor is connected to the drain of the first FinFET transistor.

A fourth aspect of the present invention provides a method, comprising: providing a semiconductor fin on a substrate, wherein a portion of the fin forms a gate region of an inverted FinFET transistor and a body region of a FinFET transistor; applying a semiconductor layer over the gate region of the inverted FinFET transistor and the body region of the FinFET transistor, wherein the semiconductor layer forms a source, drain and channel of the inverted FinFET transistor and a gate region of the FinFET transistor; and doping the semiconductor layer with a first dopant type to form the source, drain and channel of the inverted FinFET transistor and a second dopant type to form the gate region of the FinFET transistor.

A fifth aspect of the present invention provides a six device SRAM cell, comprising: a pair of cross-coupled inverters, each inverter including a pull-up inverted FinFET transistor and a pull-down FinFET transistor; and a pair of coupling FinFET transistors for respectively coupling the cross-coupled inverters to a bitline or a complement of the bitline.

The exemplary aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

Figure 1:
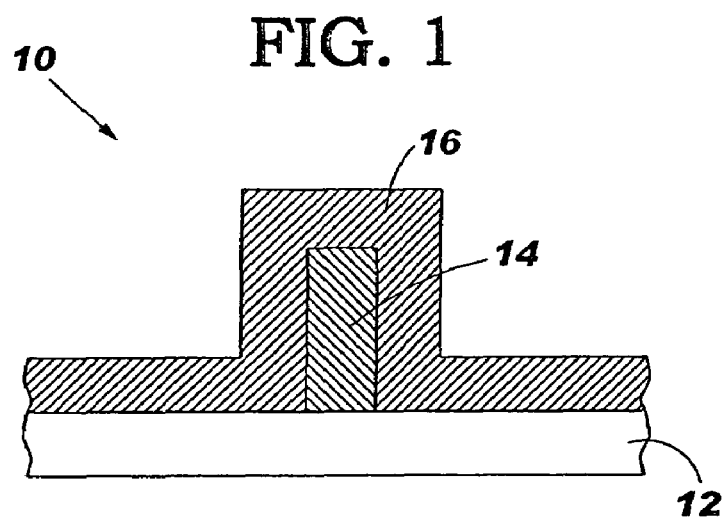
FIG. 1 is a cross-sectional view of a conventional FinFET thin film transistor.

It should be noted that the drawings are merely schematic representations, not intended to portray specific parameters of the invention. The drawings are intended to depict only typical aspects of the invention, and therefore should not be considered as limiting the scope of the invention. In the drawings, like numbering represents like elements.

BEST MODE FOR CARRYING OUT THE INVENTION

The present invention addresses the above-mentioned problems, as well as others, by providing an inverted Fin-FET thin film transistor, and a static random access memory (SRAM) cell that is formed using inverted FinFET thin film transistors.

Figure 2:
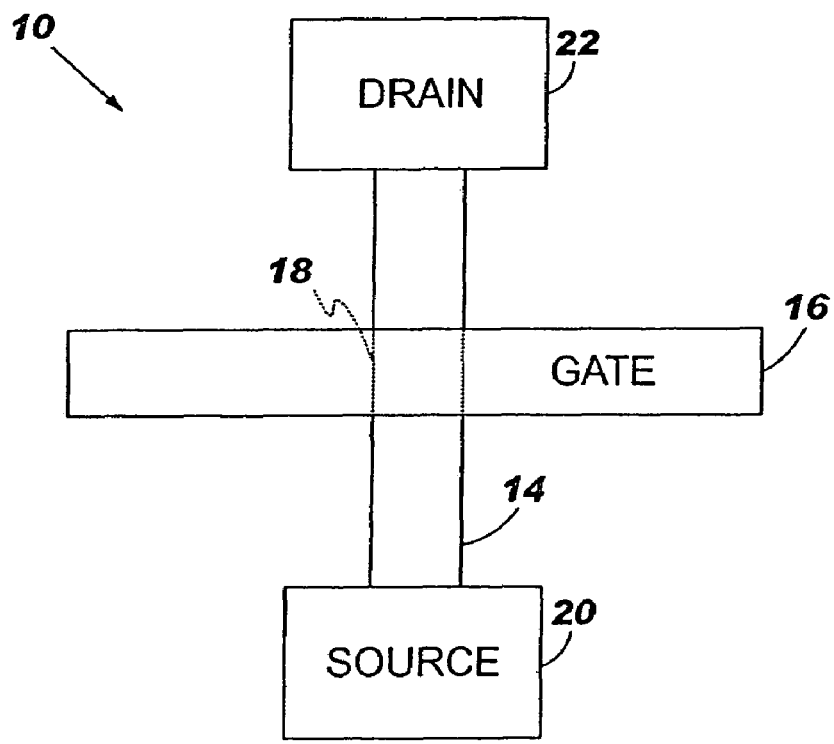
FIG. 2 is a plan view of the FinFET transistor of FIG. 1.

A cross-sectional view of a conventional FinFET thin film transistor 10 is illustrated in FIG. 1. A plan view of the FinFET transistor 10 is illustrated in FIG. 2. In this example, the FinFET transistor 10 is formed on an insulating layer 12 (e.g., a layer of $SiO_2$). The FinFET transistor 10 comprises a fin 14, typically formed of silicon or other suitable semiconductor material, and a gate 16, formed of polysilicon or other suitable conductive material, running over the fin 14. A channel 18 is formed in the portion of the fin 14 that extends under the gate 16. As shown in FIG. 2, the source 20 and drain 22 of the FinFET transistor 10 are located at opposing ends of the fin 14. The benefits provided by such a FinFET transistor 10 include, for example, smaller size, reduced power consumption, and faster switching times due to the "double gate" structure surrounding the channel 18.

Figure 3:
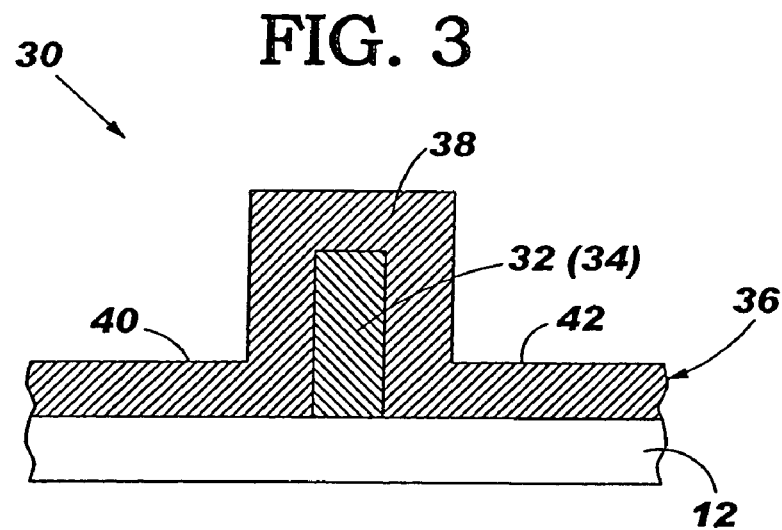
FIG. 3 is a cross-sectional view of an inverted FinFET thin film transistor in accordance with the present invention.
Figure 4:
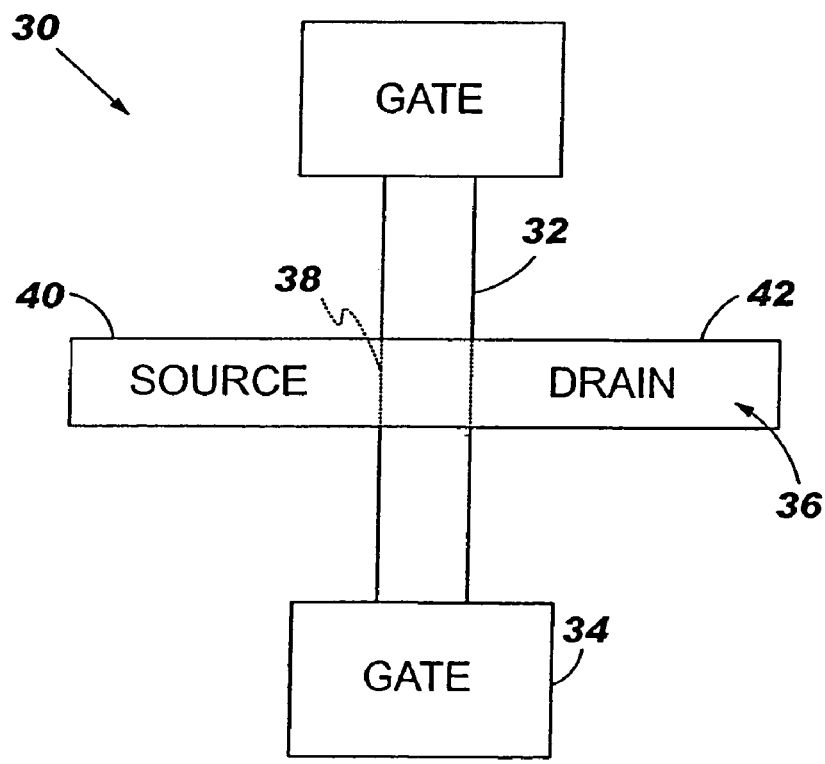
FIG. 4 is a plan view of an inverted FinFET thin film transistor in accordance with the present invention.

A cross-sectional view of an inverted FinFET thin film transistor 30 in accordance with the present invention is illustrated in FIG. 3. A plan view of the inverted FinFET transistor 30 is illustrated in FIG. 4. As shown, in the inverted FinFET transistor 30, a fin 32, typically formed of silicon or other suitable semiconductor material, acts as the gate 34 of the transistor, rather than as the body, source and drain, as would be the case for a typical FinFET transistor (e.g., see FIGS. 1-2). A layer 36, formed of polysilicon or other suitable semi-conductive material, crosses the fin 32 and forms the channel 38, source 40, and drain 42 of the inverted FinFET 30 transistor, rather than the gate, as would be the case for a typical FinFET transistor (e.g., see FIGS. 1-2). Other semiconductor and conductive materials, known to one skilled in the art, may be used to form the fin 32 and layer 36.

Figure 5:
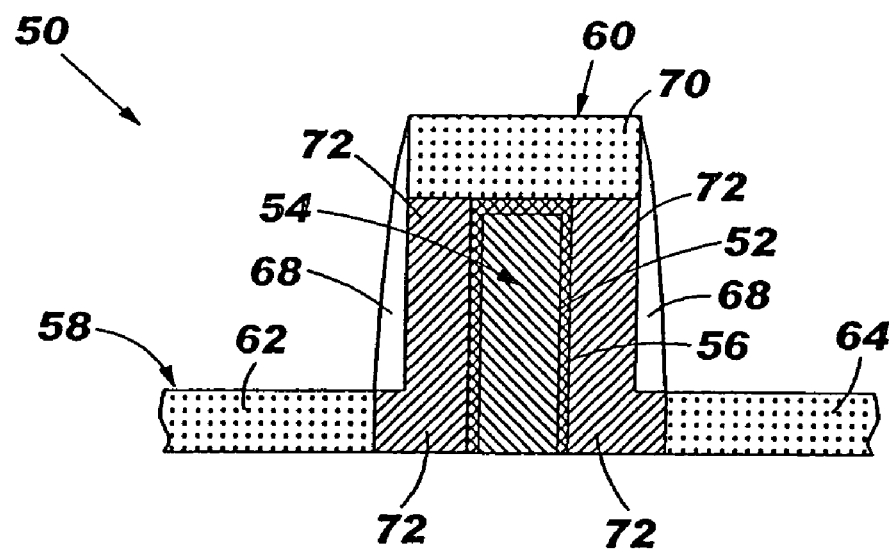
FIG. 5 is a detailed cross-sectional view of a p-channel inverted FinFET thin film transistor in accordance with the present invention.

A more detailed view of a p-channel inverted FinFET transistor 50 in accordance of the present invention is shown in FIG. 5. In this example, the p-channel inverted FinFET transistor 50 includes an n+ doped silicon fin 52 that acts as the gate 54 of the transistor 50. The gate 54 is covered by a layer 56 of a gate insulator (e.g., $SiO_2$). A layer 58 of polysilicon crosses the fin 52 and forms the body region 60 of the transistor 50. The body region 60 includes a p+ doped source 62, p+ doped drain 64, and channel 72 of the transistor 50. The channel 72 includes lightly p doped areas on either side of the gate 54 and below spacers 68, which are formed on the sides of the transistor 50, and may comprise, for example, $SiO_2$, $Si_3N_4$, etc. The p+ doped source 62 and drain 64, and a p+ doped region 70 of the body region 60 located over the gate 54, supply the channel 72 with p-type carriers. As will be presented in greater detail below, the p-channel inverted FinFET transistor 50, the operation of which may be slightly degraded because of the polycrystalline silicon which comprises channel 72, is useful as the pull-up device in a SRAM cell. The use of such a p-channel inverted FinFET transistor 50, along with the fin underpass 80 described below with regard to FIG. 6, significantly reduces the layout (i.e., surface) area of a SRAM cell compared to a SRAM cell designed using conventional CMOS techniques.

Figure 6:
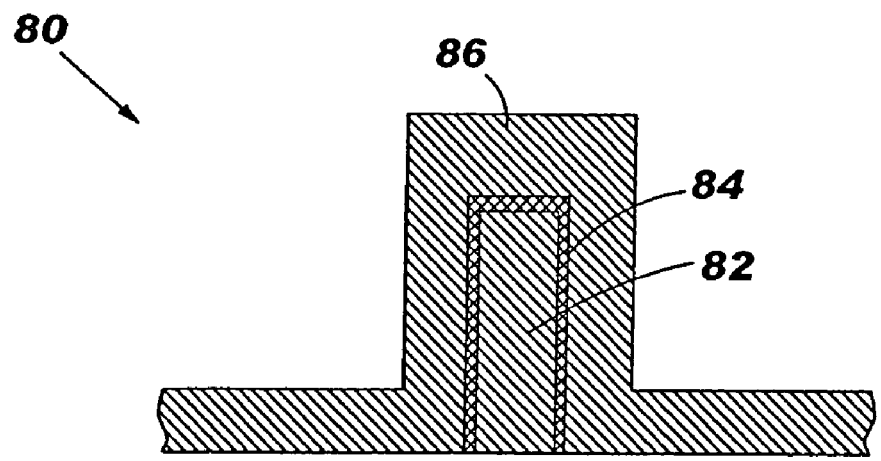
FIG. 6 is a cross-sectional view of a fin underpass in accordance with the present invention.

As illustrated in FIG. 6, the fin underpass 80 has a structure similar to that of the p-channel inverted FinFET transistor 50 described above. For example, the fin underpass 80 includes an n+ doped silicon fin 82 that is covered by an insulating layer 84 of a gate insulator such as $SiO_2$. Unlike the p-channel inverted FinFET transistor 50, however, the layer of polysilicon 86 running over the fin 82 is n+ doped. As such, the n+ doped polysilicon layer 86 passes over, and is insulated from, the n+ doped fin 82 by the insulating layer 84.

Figure 7:
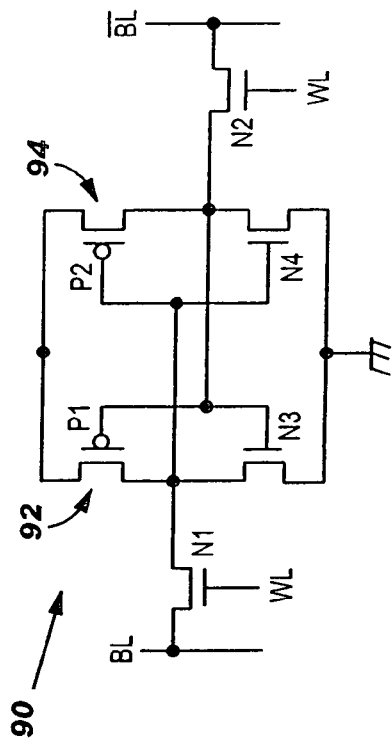
FIG. 7 is a schematic diagram of a conventional six-transistor SRAM cell.

A schematic diagram of a conventional six-transistor SRAM cell 90 is illustrated in FIG. 7. As known in the art, the SRAM cell 90 includes a pair of cross-coupled inverters 92, 94 to store a data bit state, and a pair of n-channel coupling transistors N1, N2 to read and write a data bit between the cross-coupled inverters 92, 94 and the bitlines BL, BL (BAR). The inverter 92 includes a p-channel pull-up transistor P1 and a n-channel pull-down transistor N3. Similarly, the inverter 94 includes a p-channel pull-up transistor P2 and a n-channel pull-down transistor N4. The operation of such a SRAM cell 90 is well known and will not be presented in detail. When such a six-transistor SRAM cell is produced, for example, using an industry standard 100 nm node (see, e.g., Brighten et al, "Integration of High Performance, Low Leakage and Mixed Signal Features into a 100 nm CMOS Technology," 2002 Symposium on VLSI Technology, Digest of Technical papers P 62-3, June 2002), the resultant standard SRAM cell size is approximately 1.26 $\mu m^2$. By using the processes of the present invention, however, a SRAM cell can be produced that is approximately 65% of the size of a standard SRAM cell produced using an industry standard 100 nm node.

Figure 8:
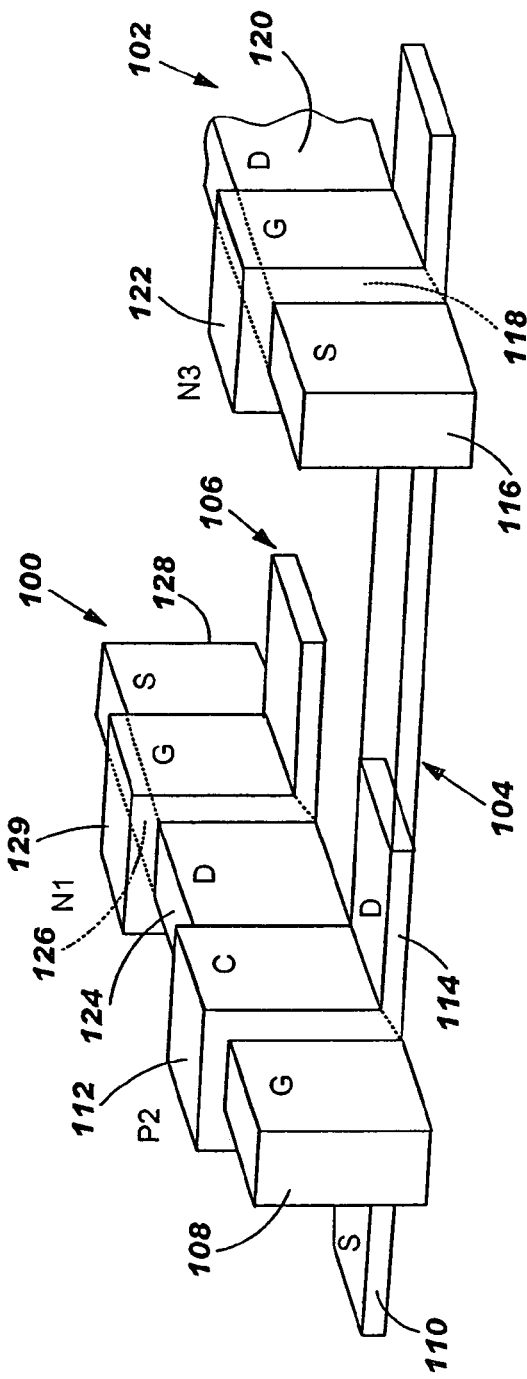
FIG. 8 is a perspective view of the transistors P2, N1, and N3 of the six-transistor SRAM cell illustrated in FIG. 7, formed in accordance with the present invention.

The formation of the transistors P2, N1, and N3 (FIG. 7), using a p-channel inverted FinFET transistor in accordance with the present invention, and two n-channel FinFET transistors, respectively, is illustrated in FIG. 8. The process flow for forming the inverted FinFET transistor and FinFET transistor, as well as a fin underpass and a fin-based buried contact, will be presented in detail below.

As shown in FIG. 8, silicon fins 100, 102 are formed in the same process step on a substrate. The silicon fins 100, 102 may comprise separate fins, or may comprise different portions of the same fin. A layer 104 of polysilicon extends between, and passes over the sides and tops of, the fins 100 and 102. A layer 106 of polysilicon, formed in the same process step as the layer 104 of polysilicon, passes over the sides and top of the fin 100.

To form the p-channel inverted FinFET transistor P2, a portion of the silicon fin 100 is n+ doped to produce the gate 108 of P2, while a portion of the layer 104 of polysilicon is p+ doped to form a body region including the source 110, channel 112, and drain 114 of P2. The channel 112 of P2 passes over the gate 108. The source 110 and drain 114 of P2 are located on either side of the gate 108 and are connected by the channel 112.

The body region of the n-channel FinFET transistor N3, including the source 116, channel 118, and drain 120, is formed using a lightly doped portion of the fin 102. The gate 122 of N3 is formed using a n+ doped portion of the polysilicon layer 104. Thus, the polysilicon layer 104 is used to form the gate 122 of N3 and the source 110, channel 112, and drain 114 of P2. Further, the polysilicon layer 104 connects the gate 122 of N3 to the drain 114 of P2. A self-aligned metal silicide (not shown), such as $CoSi_2$, can be used to bridge the n+ to p+ junction in the polysilicon layer 104 to ensure good electrical conductivity from gate 122 to drain 114.

The body region of the n-channel FinFET transistor N1, including the drain 124, channel 126, and source 128, is formed using a lightly doped portion of the fin 100. The gate 129 of N1 is formed using a n+ doped portion of the layer 106 of polysilicon. Thus, the fin 100 is used to form the gate 108 of P2 and the drain 124, channel 126, and source 128 of N1. Further, the fin 100 connects the gate 108 of P2 to the drain 124 of N1.

Figure 9:
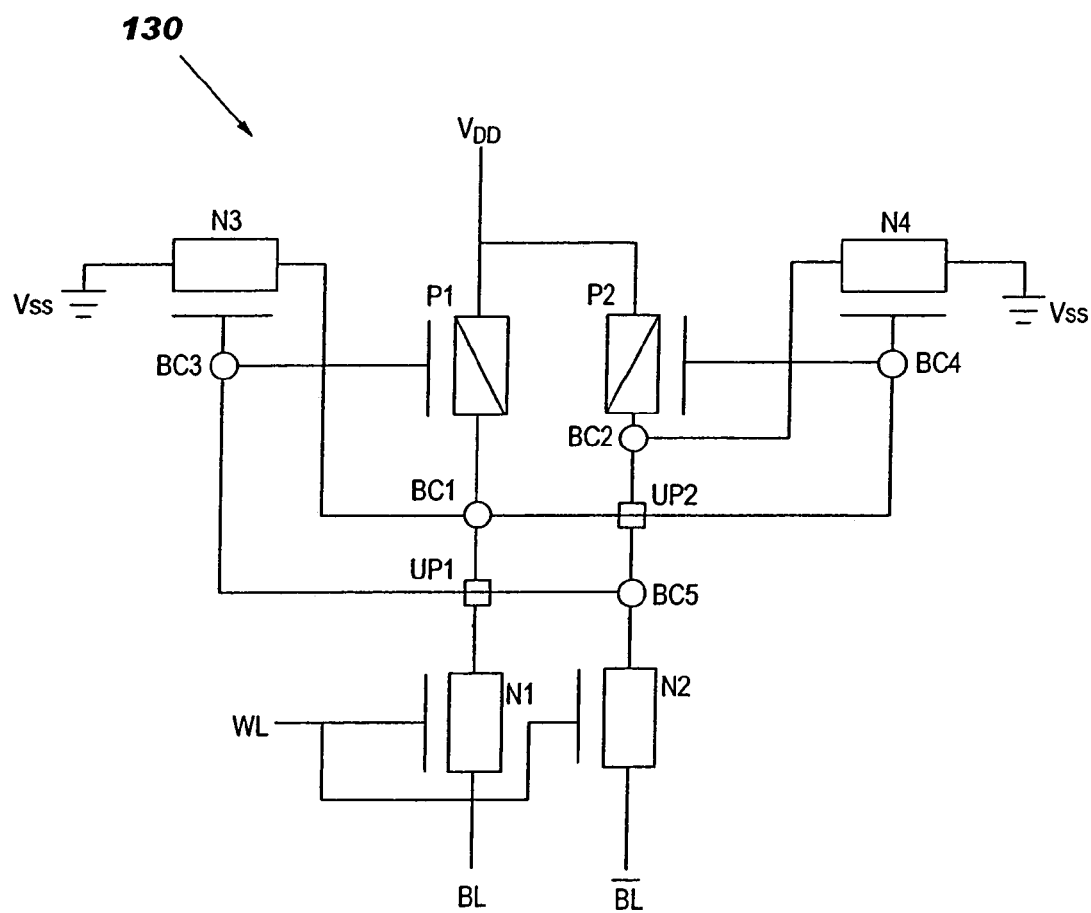
FIG. 9 is a schematic diagram of a six-transistor SRAM cell formed in accordance with the present invention.

A six-transistor SRAM cell 130 formed in accordance with the present invention is illustrated in FIG. 9. The SRAM cell 130 operates in a convention manner. The SRAM cell 130 is formed using two p-channel inverted FinFET transistors P1, P2, four n-channel FinFET transistors N1, N2, N3, and N4, two fin underpasses UP1, UP2, and five fin-based buried contacts BC1, BC2, BC3, BC4, and BC5. In the SRAM cell 130, the underpass UP1 allows the conductive path between the drain of N1 and BC1 to insulatively pass under the conductive path between BC3 and BC5. Similarly, the underpass UP2 allows the conductive path between BC5 and BC2 to insulatively pass under the conductive path between BC1 and BC4. By using this unique combination of structures, the layout of the SRAM cell 130 is simplified, and the size of the SRAM cell 130 is significantly reduced compared to a standard SRAM cell with similar minimum feature sizes produced using known techniques. Before presenting the layout of the SRAM cell 130 of the present invention, an exemplary process flow for producing a p-channel inverted FinFET transistor, n-channel FinFET transistor, fin underpass, and fin-based buried contact in accordance with the present invention will be described with regard to FIGS. 10-26.

In the following exemplary description of the process flow for producing a p-channel inverted FinFET transistor, n-channel FinFET transistor, fin underpass, and fin-based buried contact, numerous masking, patterning, etching, stripping, growing, depositing, and implanting steps are described in general terms. It should be noted that although the specific details required to perform these steps have been omitted for brevity and clarity, these details are nonetheless well known to those skilled in the art of semiconducting processing. It should also be noted that alternate materials known to those skilled in the art may exist for each of the materials used in the formation of the p-channel inverted FinFET transistor, n-channel FinFET transistor, fin underpass, and fin-based buried contact. Further, although described below for use in a SRAM cell, the p-channel inverted FinFET transistor, n-channel FinFET transistor, fin underpass, and fin-based buried contact may also be used individually or in other combinations in other semiconductor devices. The doping of these structure may also vary. For example, a n-channel inverted FinFET transistor may be formed by using p-type doping in place of n-type doping and vice-versa.

Figure 10:
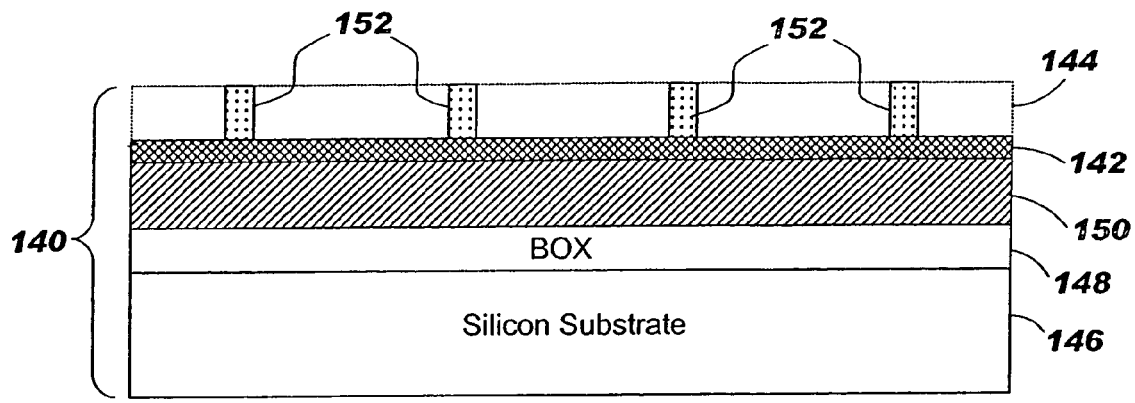
FIGS. 10-26 illustrate the process flow for forming a p-channel inverted FinFET transistor (P-IFinFET), fin underpass (UP), n-channel FinFET transistor (FinFET) and fin-based buried contact (BC) in accordance with the present invention.

Initially, as shown in FIG. 10, a layer 142 of SiO₂ and a masking layer 144 of Si₃N₄ are formed on a silicon-on-insulator (SOI) wafer 140. The SOI wafer 140 comprises a silicon substrate 146, a buried oxide (BOX) layer 148, and a layer of silicon 150 approximately 30 nm to 170 nm thick. The Si₃N₄ layer is patterned and etched to provide Si₃N₄ shapes 152 that are approximately 5 nm to 30 nm wide.

Figure 11:
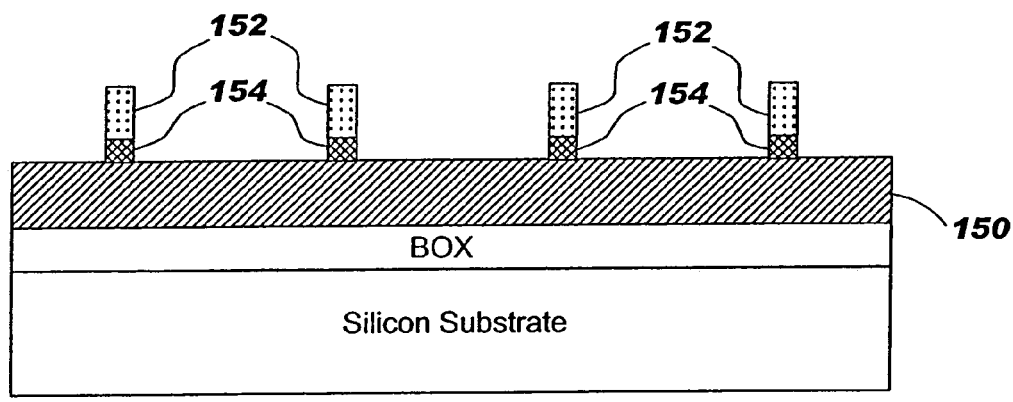

Using the Si₃N₄ shapes 152 as a mask, the SiO₂ layer 142 is patterned and etched to form SiO₂ shapes 154 as shown in FIG. 11. The SiO₂ layer 142 is first etched using an anisotropic etch. This is followed by an isotropic oxide etch to adjust the final width of the SiO₂ shapes 154.

Figure 12:
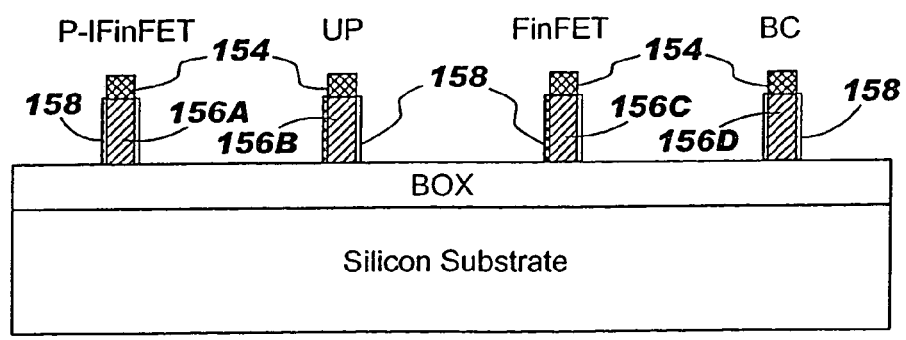

In FIG. 12, after stripping the Si₃N₄ shapes 152, the SiO₂ shapes 154 are used as a mask during an anisotropic etch of the silicon layer 150. The etching stops at the surface of the BOX layer 148. The resultant silicon fins 156A, 156B, 156C, and 156D, having a width of approximately 1 nm to 30 nm, are used to form the fin portions of a p-channel inverted FinFET transistor (P-IFinFET), a fin underpass (UP), a n-channel FinFET transistor (FinFET) and a fin-based buried contact (BC). A layer 158 of sacrificial SiO₂, approximately 1.5 nm to 6 nm thick, is then grown on the sides of the silicon fins 156A-D. The layer 158 of sacrificial SiO₂ protects the silicon fins 156A prior to, and during, a subsequent implantation step.

Figure 13:
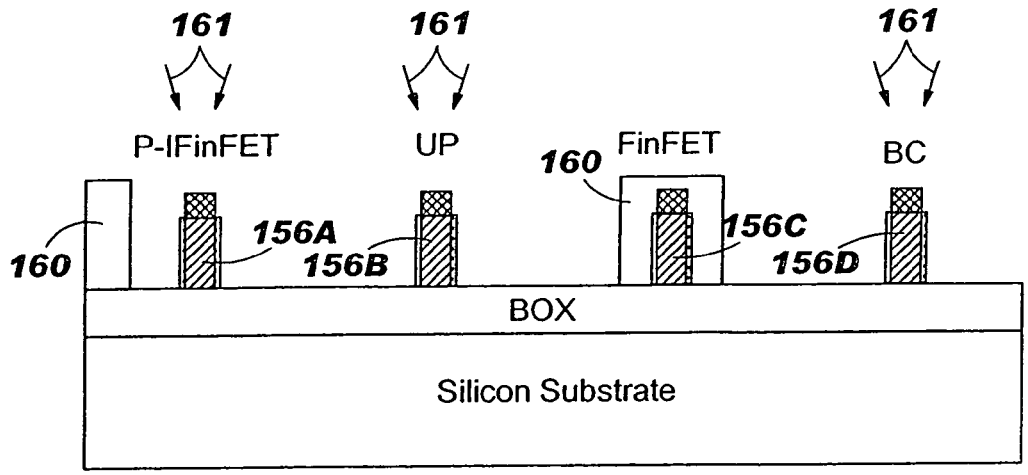
Figure 14:
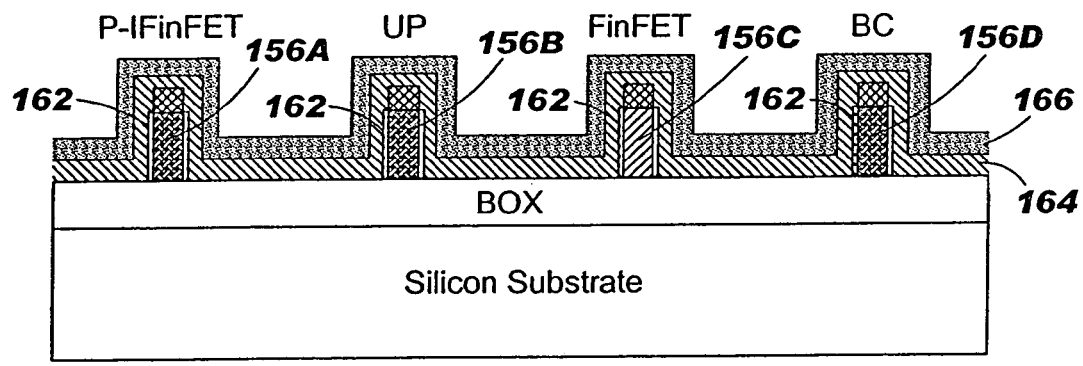
Figure 15:
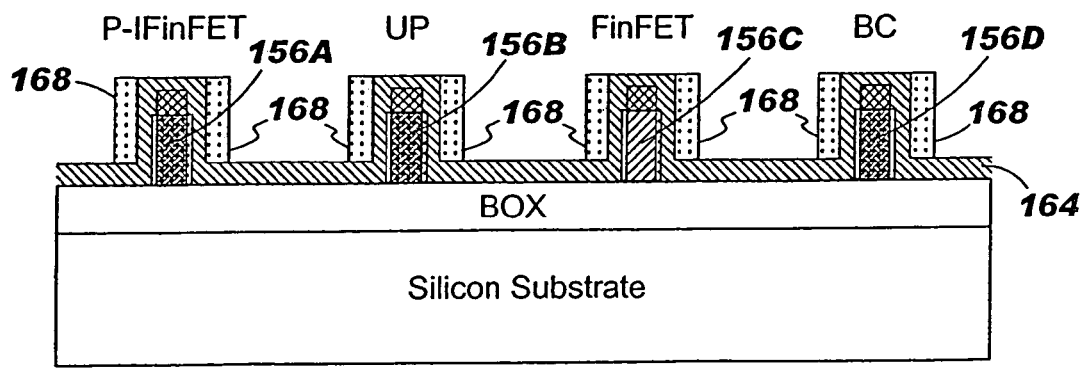

A photoresist mask layer 160 is then applied and patterned to selectively expose the fins 156A, 156B, and 156D as illustrated in FIG. 13. The fin 156C remains covered by the mask layer 160. An n-type dopant 161, such as phosphorus or arsenic, is then implanted via ion implantation into the exposed fins 156A, 156B, and 156D. The fin 156C remains undoped because of the remaining mask layer 160. After implantation, the remaining mask layer 160 and the sacrificial SiO₂ layer 158 are stripped away. A layer 162 of gate insulator, such as SiO₂, is then grown/deposited on the fins 156A, 156B, 156C, and 156D as illustrated in FIG. 14. A layer 164 of undoped polysilicon is then deposited to a thickness of approximately 10 nm to 75 nm. The thickness of the undoped polysilicon layer 164 is less than the combined thicknesses of the silicon layer 150 and the SiO₂ layer 142 (FIG. 10). A layer 166 of a spacer material, such as SiO₂, approximately 5 nm to 75 nm thick, is then deposited on the undoped polysilicon layer 164. As illustrated in FIG. 15, the spacer layer 166 is then anisotropically etched to form sidewall spacers 168 on the undoped polysilicon layer 164. At this point in the process, the fins 156A, 156B, and 156D are n+ doped, while the fin 156C is undoped.

Figure 16:
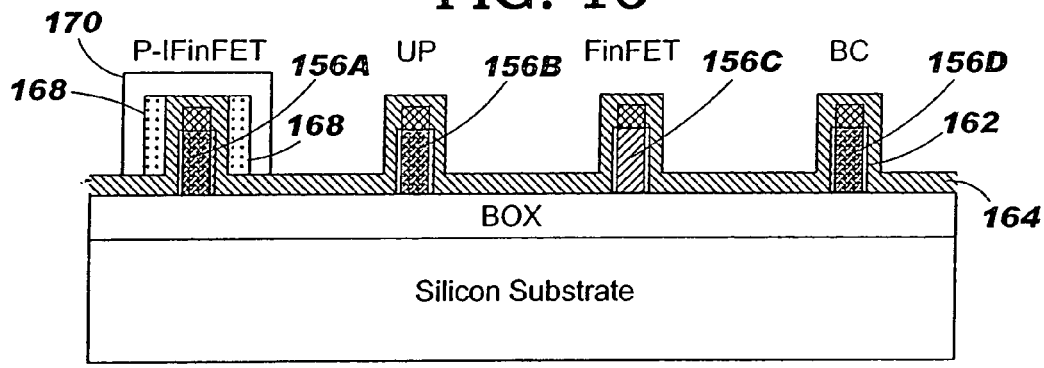
Figure 17:
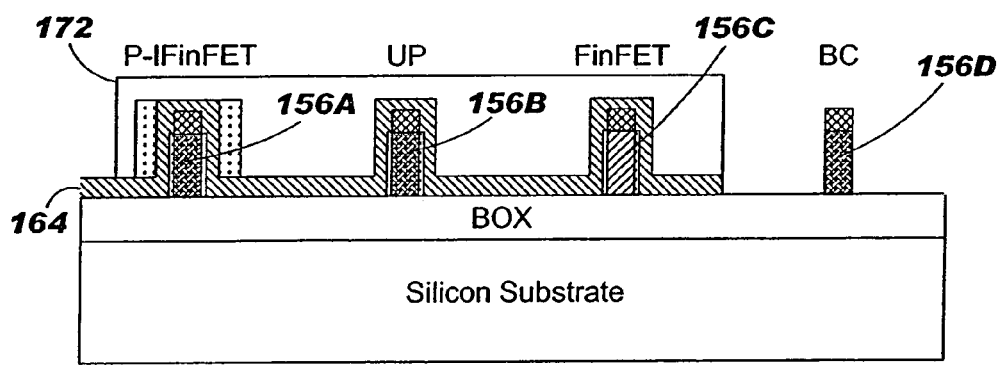
Figure 18:
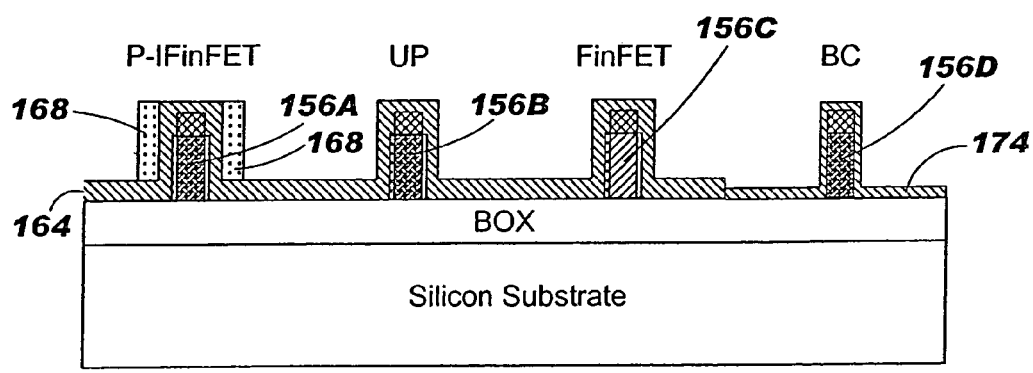

In FIG. 16, a photoresist mask layer 170 is applied and patterned to selectively mask off the P-IFinFET region around the fin 156A where the p-channel inverted FinFET transistor is to be formed. The exposed sidewall spacers 168 next to the fins 156B, 156C, and 156D are then isotropically etched away. Thereafter, as shown in FIG. 17, all regions except for the BC region are selectively masked off with a BC photoresist mask 172. The polysilicon layer 164 in the exposed BC region is then etched away and the exposed layer 162 of gate oxide on the sides of the fin 156D is stripped away. After the mask 172 has been stripped away, a thin film 174 of undoped polysilicon is deposited as shown in FIG. 18. The polysilicon layer 174 is selectively etched back with a mask (not shown) selectively covering the other structures until the sidewall spacers 168 next to the fin 156A are exposed.

Figure 19:
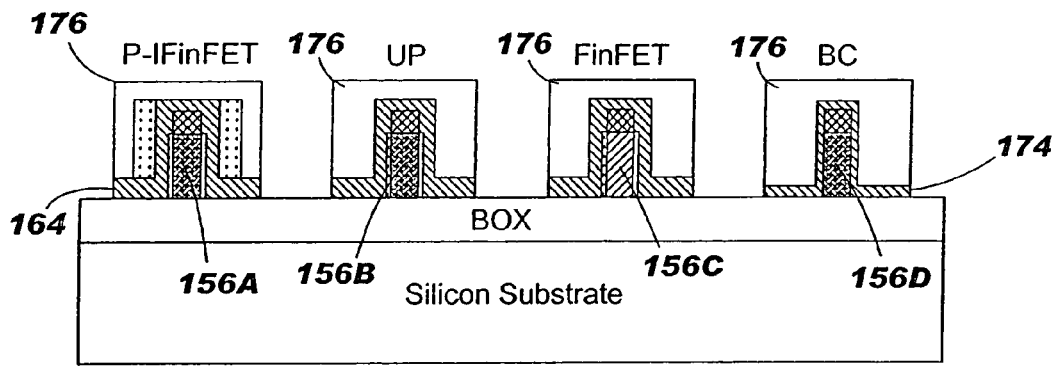
Figure 20:
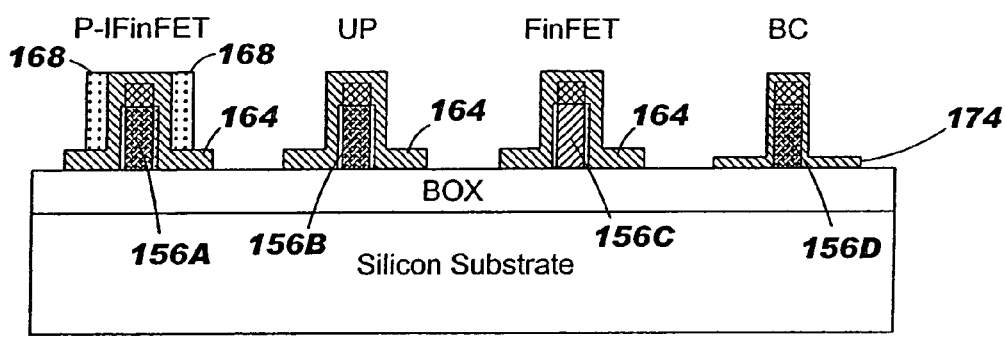
Figure 21:
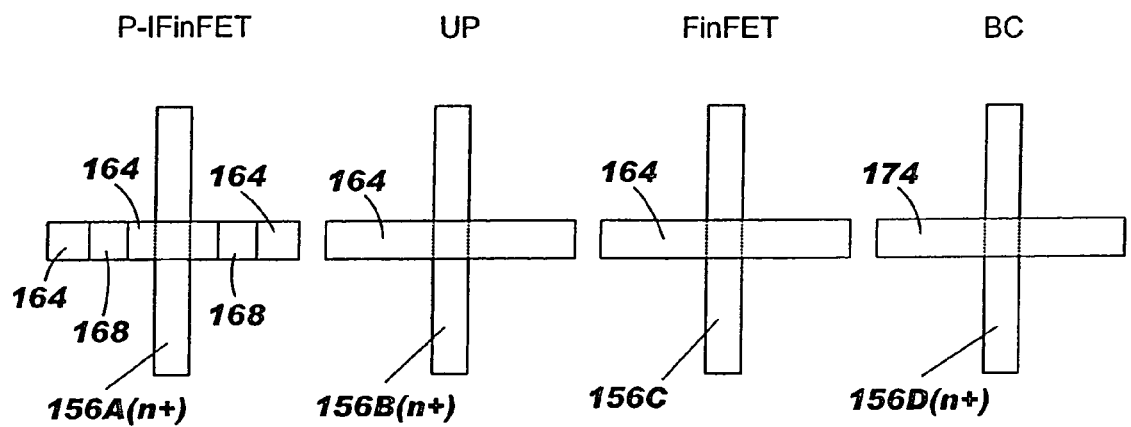

The next step in the process is illustrated in FIG. 19. In particular, a photoresist mask layer 176 is deposited and patterned to cover the P-IFinFET, UP, FinFET and BC regions. The unmasked areas of the polysilicon layers 164, 174 are then etched away. The mask layer 176 is then stripped away as shown in FIG. 20. A top view corresponding to FIG. 20 is provided in FIG. 21. At this point in the process, fins 156A, 156B, and 156D are all n+ doped, fin 156C is undoped, and polysilicon layers 164, 174 are undoped.

Figure 22:
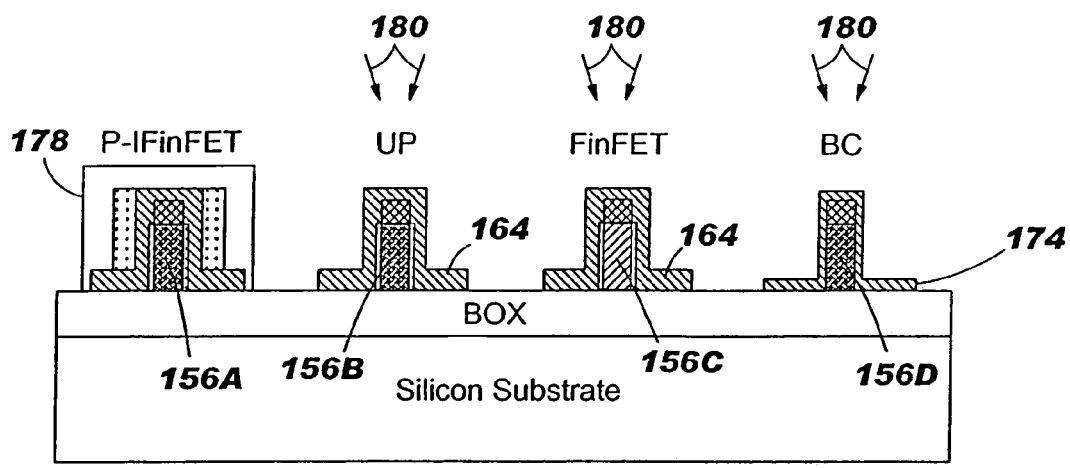

As shown in FIG. 22, a n-implant photoresist mask layer 178 is deposited and patterned to selectively cover the P-IFinFET region. An n-type dopant 180, such as phosphorus or arsenic, is then implanted via ion implantation into the undoped polysilicon layers 164, 174, of the UP, FinFET and BC regions. After implantation, the mask layer 178 is stripped away.

Figure 23:
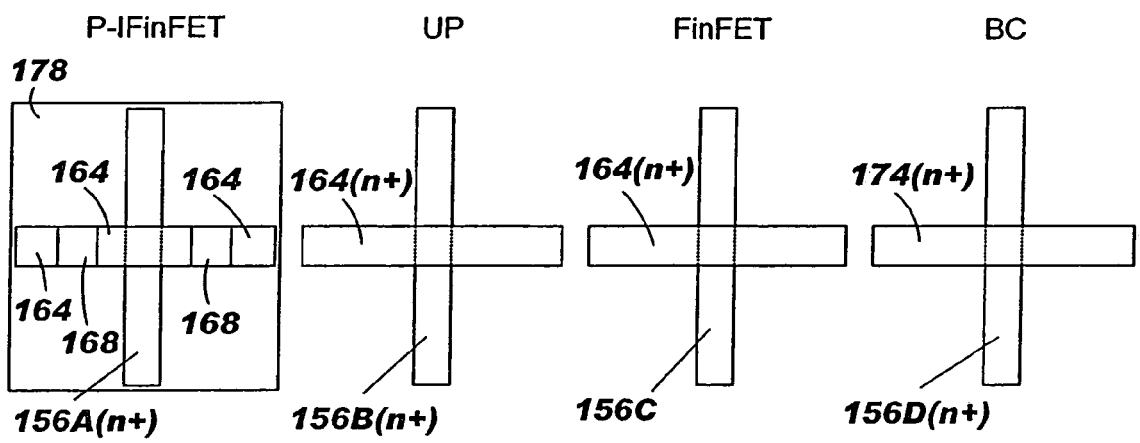

A top view corresponding to FIG. 22 is provided in FIG. 23. At this point in the process, fins 156A, 156B, and 156D are n+ doped, fin 156C is lightly n doped, the polysilicon layers 164, 174 of the UP, FinFET and BC regions are n+ doped, and the polysilicon layer 164 in the P-IFinFET region remains undoped. The formation of the UP, FinFET, and BC used in the SRAM cell 130 of the present invention is now complete.

Figure 24:
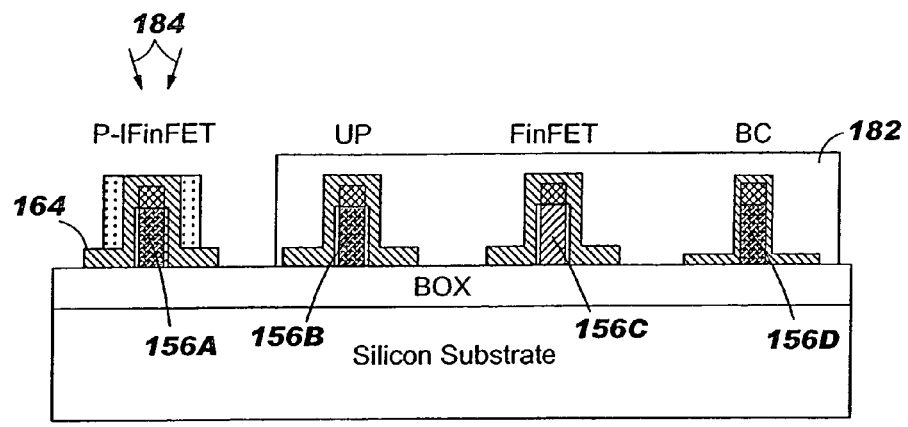
Figure 25:
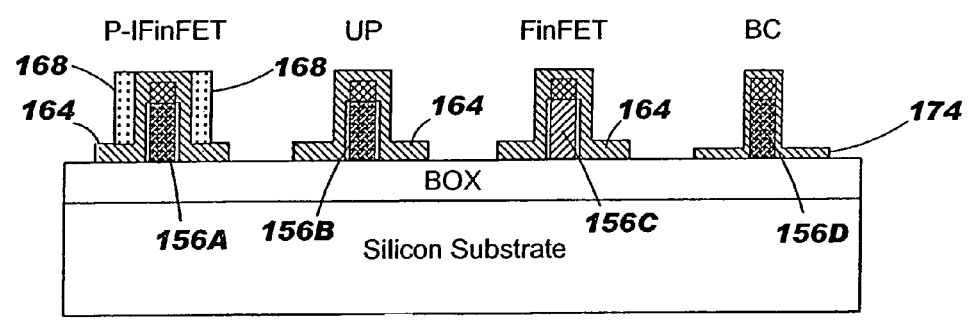
Figure 26:
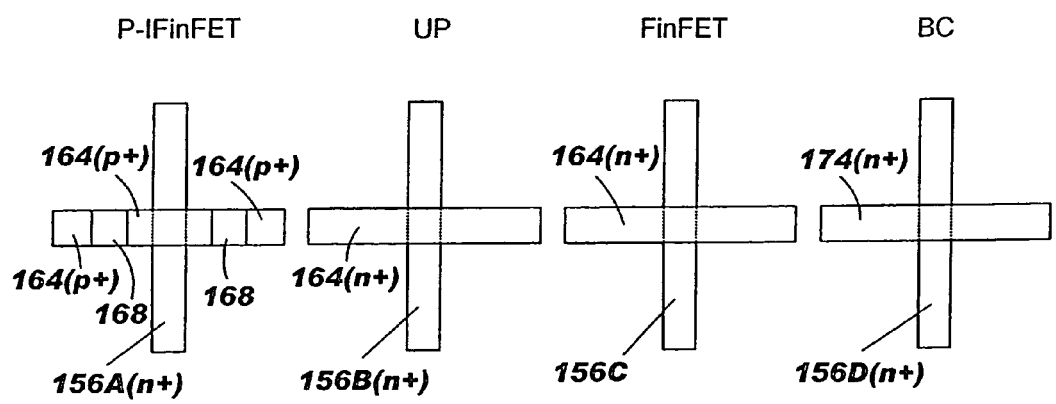

As shown in FIG. 24, a p-implant photoresist mask layer 182 is then deposited and patterned to selectively cover the UP, FinFET and BC regions. A p-type dopant 184, such as boron, is then implanted via ion implantation into the undoped polysilicon layer 164 of the P-IFinFET region. After implantation, the mask layer 182 is stripped away as shown in FIG. 25. At this point in the process, fins 156A, 156B, and 156D are n+ doped, fin 156C is lightly n doped, the polysilicon layers 164, 174 in the UP, FinFET and BC regions are n+ doped, and the polysilicon layer 164 in the P-IFinFET region is p+ doped (lightly doped under the sidewall spacers 168). A light oxidation (approximately 1 nm to 6 nm thick) follows. A top view corresponding to FIG. 25 is provided in FIG. 26. Spacers, selective silicon, source/drain and gate contacts are then applied (not shown) as per conventional FinFET processing.

Figure 27:
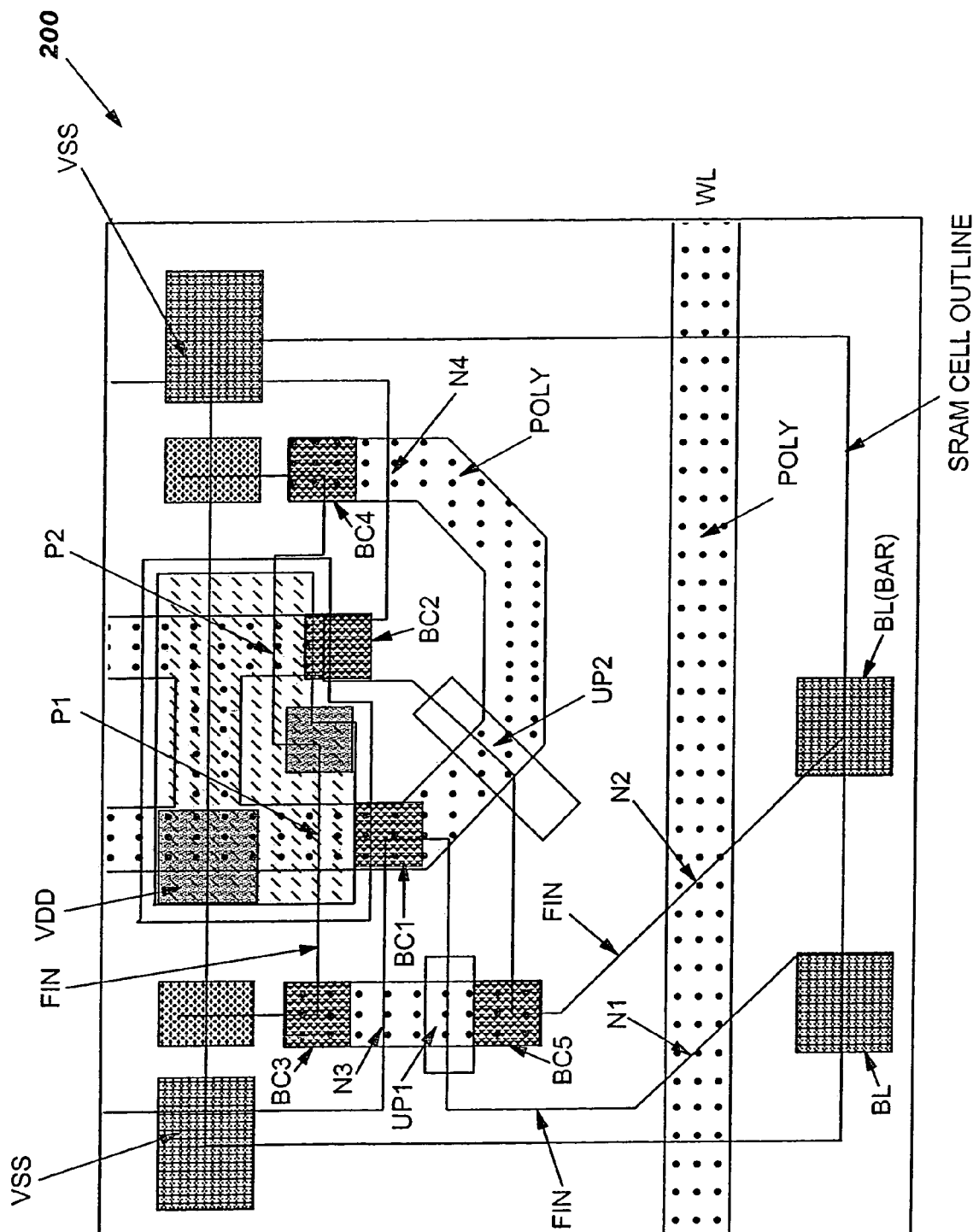
FIG. 27 depicts a layout of a SRAM cell produced in accordance with the present invention.

FIG. 27 depicts a layout 200 of an SRAM cell 130 (see, e.g., FIG. 9) produced in accordance with the present invention. The layout of the SRAM cell 130 includes two p-channel inverted FinFET transistors P1, P2, four n-channel FinFET transistors N1, N2, N3, and N4, two fin underpasses UP1, UP2, and five fin-based buried contacts BC1, BC2, BC3, BC4, and BC5, each formed in accordance with the process flow detailed in FIGS. 10-26. The silicon fins (e.g., fins 100, 102, FIG. 8 and fins 156 A-D, FIG. 26) are labeled as "FIN" in FIG. 27. The polysilicon layers (e.g., polysilicon layers 104, 106, FIG. 8 and polysilicon layers 164, 174) are labeled as "POLY" in FIG. 27. The layout 200 produced in accordance with the present invention is simpler and more compact than a SRAM cell designed using known CMOS techniques.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

INDUSTRIAL APPLICABILITY

The invention is useful for integrated circuit processing, and more particularly for producing an inverted FinFET thin film transistor, and for producing denser static random access memory (SRAM) using inverted FinFET thin film transistors.

The invention claimed is:

1. An integrated circuit having at least first and second inverted FinFet transistors (P2, N3), said at least first FinFet transistor (P2), comprising:
a first gate region (108) including a semiconductor structure (100) on a substrate; and
a first body region including a semiconductor layer (104) having a first channel region (112) disposed on the first gate region and a source (110) and drain (114) formed on either side of the first channel region; and said at least second FinFet transistor (N3) coupled to said at least first transistor, comprising:
a second body region including the semiconductor structure (102) having a second channel region (118) and a source (116) and drain (120) formed on either side of the second channel region; and
a second gate region (122) including the semiconductor layer (104), disposed on the second channel region.

2. The integrated circuit of claim 1, wherein the semiconductor structure (100, 102) comprises a silicon fin.

3. The integrated circuit of claim 1, wherein the drain (114) of the first transistor (P2) is connected to the gate (122) of the second transistor (N3) by the semiconductor layer (104).

4. The integrated circuit of claim 1, further comprising a third FinFet transistor (N1), that includes:
a third body region including the semiconductor structure (100), having a third channel region (126) and a source (128) and drain (124) formed on either side of the third channel region; and
a third gate region (129) including the semiconductor layer (106) disposed on the third channel region.

5. The integrated circuit of claim 4, wherein the gate (108) of the first FinFet transistor (P2) is connected to the drain (124) of the third FinFet transistor (N1) by the semiconductor structure (100).

6. The integrated circuit of claim 4, wherein the FinFet first transistor (P2) comprises an inverted FinFET transistor.

7. The integrated circuit of claim 1, further comprising an underpass (80), wherein the underpass allows a portion of the semiconductor structure (82) having a first doping type to insulatively pass under a portion of the semiconductor layer (86) having the first doping type.

8. The integrated circuit of claim 1, wherein the first FinFET transistor (P2) comprises a pull-up transistor of an SRAM cell (130), and the second FinFET transistor (N3) comprises a pull-down transistor of the SRAM cell.

* * * * *